United States Patent [19]
McAuliffe et al.

[11] Patent Number: 4,998,180
[45] Date of Patent: Mar. 5, 1991

[54] BUS DEVICE WITH CLOSELY SPACED DOUBLE SIDED DAUGHTER BOARD

[75] Inventors: Scott C. McAuliffe, Charlton; Byron D. Coleman, Holliston, both of Mass.

[73] Assignee: Clearpoint Research Corporation, Hopkinton, Mass.

[21] Appl. No.: 355,487

[22] Filed: May 23, 1989

[51] Int. Cl.$^5$ .......................... H05K 1/14; H05K 7/20
[52] U.S. Cl. .................... 361/383; 165/80.3; 361/396; 361/413
[58] Field of Search .................. 361/407, 412, 413 X, 361/382, 383 X, 384, 396 X; 174/16.1; 165/80.3 X; 357/82

[56] References Cited

U.S. PATENT DOCUMENTS

| | | | |
|---|---|---|---|
| 3,478,251 | 11/1969 | Perotto | 361/396 |
| 4,399,484 | 8/1983 | Mayer | 361/383 |
| 4,839,774 | 6/1989 | Hamburgen | |

OTHER PUBLICATIONS

Stackable Plastic Chip carrier, Robock, IBM Tech. Discl. Bull., vol. 27, No. 4B, Sep. 1984, p. 2389.

Primary Examiner—Gerald P. Tolin
Attorney, Agent, or Firm—Edward W. Porter

[57] ABSTRACT

A bus device, such as a memory board, is provided with a mother board and a daughter board mount at a predetermined distance above the surface of the mother board. The daughter board has integrated circuit components, such a memory chips, mounted on both of its sides. Means are provided for connecting the wires on the daughter board with those of the mother board and for connecting the wires on the mother board with the conductors of a system bus. In the preferred embodiment of the invention the distance at which the daughter board is mounted above the surface of the mother board is less than twice the maximum thickness of the electronic components mounted on the side of the memory board facing the mother board. The portion of the mother board under these components contains no electronic components itself. Instead, that portion of the mother board contains at least one ventilation opening to ventilate the components on the side of the daughter board that faces the mother board. The preferred embodiment allows two layers of chips to be mounted in a computer slot in which the maximum permissible extent to which components may stick out from the back of a bus device is too small to allow chips to be mounted on the back of the mother board.

7 Claims, 5 Drawing Sheets

BUS DEVICE WITH CLOSELY SPACED DOUBLE SIDED DAUGHTER BOARD

FIELD OF THE INVENTION

The present invention relates to electronic component boards of a type which are plugged into the bus of electronic systems, such as computer systems.

BACKGROUND OF THE INVENTION

It is very common to build electronic systems which are designed to have one or more component boards plugged into them. In many such systems, such as in many computer systems, there is a common bus, comprised of a plurality of parallel conductors. A plurality of usually parallel bus connectors are mounted on the bus and the electronic component boards can be plugged into such a bus. Usually the parallel conductors of the bus are contained on a printed circuit board, which is called the backplane of the system. Usually the parallel bus connectors are mounted in a parallel manner perpendicular to the parallel conductors of the bus. And usually each component board is also formed of a printed circuit board which has connectors on one edge, which connectors are designed to mate with the bus connectors. Often the backplane printed circuit board is mounted in some sort of box or frame, which is designed to give support to the backplane. Such frames usually contain card guides designed to hold and give support to one or both side edges of a component printed circuit board when the bottom edge of that board is mated with the bus connectors.

As the software and applications run on computer and other electronic systems become larger, it becomes increasingly desirable to be able to pack a greater number of electronic components into the same volume. This means that it is desirable to be able to place an increased number of components on printed circuit boards. For example, it has been common to increase the number of memory chips that can be placed on memory boards by making boards which have memory chips mounted on both sides of their printed circuit card. It has also been common to make memory boards which are actually comprised of two boards, a mother board which fits into the card guides and bus connectors and which carries chips on one or two sides, and a daughter board which is mounted parallel to the mother board on spacers which stick up from one side of the mother board. Such a daughter board will also have chips on one or both sides.

One of the problems, however, with schemes such as mounting chips on both sides of a board or of using boards with daughter boards is that the space allowed for boards in a given computer or electronic system is often limited. In fact, it is most often limited by the need for a given board to able to fit into a given connector on a bus without encroaching into the space reserved for possible boards in adjacent bus connectors. To make it easier for different companies that manufacture boards used in a given system to fit into adjacent bus slots without touching or blocking each other, manufacturers of computers often announce specifications which limit the size of boards designed to fit into the bus slots of their computers. These specifications state a maximum permissible extent to which components may stick out on each side of the parallel bus connectors on the computer system's bus.

It should be noted that traditionally computer boards have had a front on which all the larger components, such as chips, capacitors, and resistors, were mounted and a back on which no such larger components were mounted. For this reasons the specifications for the size limitations for most boards have been asymmetrical, that is, they specify that the maximum permissible extent to which components may stick out on one side, which we shall call the front, of a bus connector is much greater than the maximum permissible extent to which they may stick out from the other side, which we shall call the back. This is beneficial when all the large components of a board are placed on one side, as was traditionally the case. But it can be a problem if one wishes to place components, such as memory chips, on both sides of a board, since often the thickness of such memory chips exceeds the maximum permissible extent which components are allowed to stick out from the back side of a board according to such bus specifications.

Furthermore, the maximum permissible extent on the front side of boards is often not large enough to allow a board to have one layer of chips mounted on its front side and a daughter board mounted parallel to that front side which also has a layer of chips. This is because chips, which generate heat, require ventilation and, thus, if a daughter board is to be placed over a layer of chips on its mother board it is necessary for there to be a sufficient distance between the chips on the mother board and the daughter board to allow for proper ventilation.

SUMMARY OF THE INVENTION

It is an object of the present invention to provide a bus device which allows a relatively large number of components to be mounted on it while fitting into a relatively small bus slot.

It is another object of the present invention to provide a bus device which allows a relatively large number of a given type of components to be mounted into a bus slot for which the bus specification states that the maximum permissible extent of components from the back of boards is too narrow to allow components of the given type to be mounted on the back of a board.

It is also an object of the invention to provide a bus device which has a mother board and a daughter board and which allows the daughter board to have relatively good ventilation, while at the same time minimizing the distance between the mother and daughter boards.

It is a further object of this invention to provide a memory board which allows a relatively larger number of memory chips to be mounted into a bus slot for which the bus specification states that the maximum permissible extent of components from the back of boards is too narrow to allow such memory chips to be mounted on the back of a board.

The present invention relates to a bus device, such as a memory board, for mating with a multi-conductor bus connector connected to the multiple conductors of the system bus of a computer or other electronic system. The bus device includes a daughter board in the form of a printed circuit board. This daughter board has circuit components, such a memory chips, mounted on both of its sides and a plurality of printed circuit wires connected to those components. The bus device also has a mother printed circuit board. The mother board has a plurality of connector contacts for mating with the bus connector and, thus, making connection with conductors of the system bus. The mother board also has a plurality of printed circuit wires and means for connecting those wires to the connector contacts. The bus device has means for supporting the daughter board in a parallel manner at a predetermined distance above the surface of the mother board, and it has means for electrically connecting the wires of the daughter and mother boards.

In the preferred embodiment of the invention the distance at which the daughter board is mounted above the surface of the mother board is less than twice the maximum thickness of the components mounted on the side of the memory board facing the mother board. The portion of the mother board under these components contains no chips itself. Instead that portion of the mother board contains at least one ventilation opening to ventilate the components on the daughter board that face the mother board. The preferred embodiment is designed for use in a computer slot in which the maximum permissible extent by which components are supposed to stick out from the rear of a board is too small to allow chips having the maximum thickness of the chip mounted on both sides of the daughter board to be mounted on the back side of the mother board.

DESCRIPTION OF THE DRAWINGS

These and other aspects of the present invention will become more evident upon reading the following description of the preferred embodiments in conjunction with the accompanying drawings, in which.

DETAILED DESCRIPTION OF PREFERRED EMBODIMENTS

Figure 1:
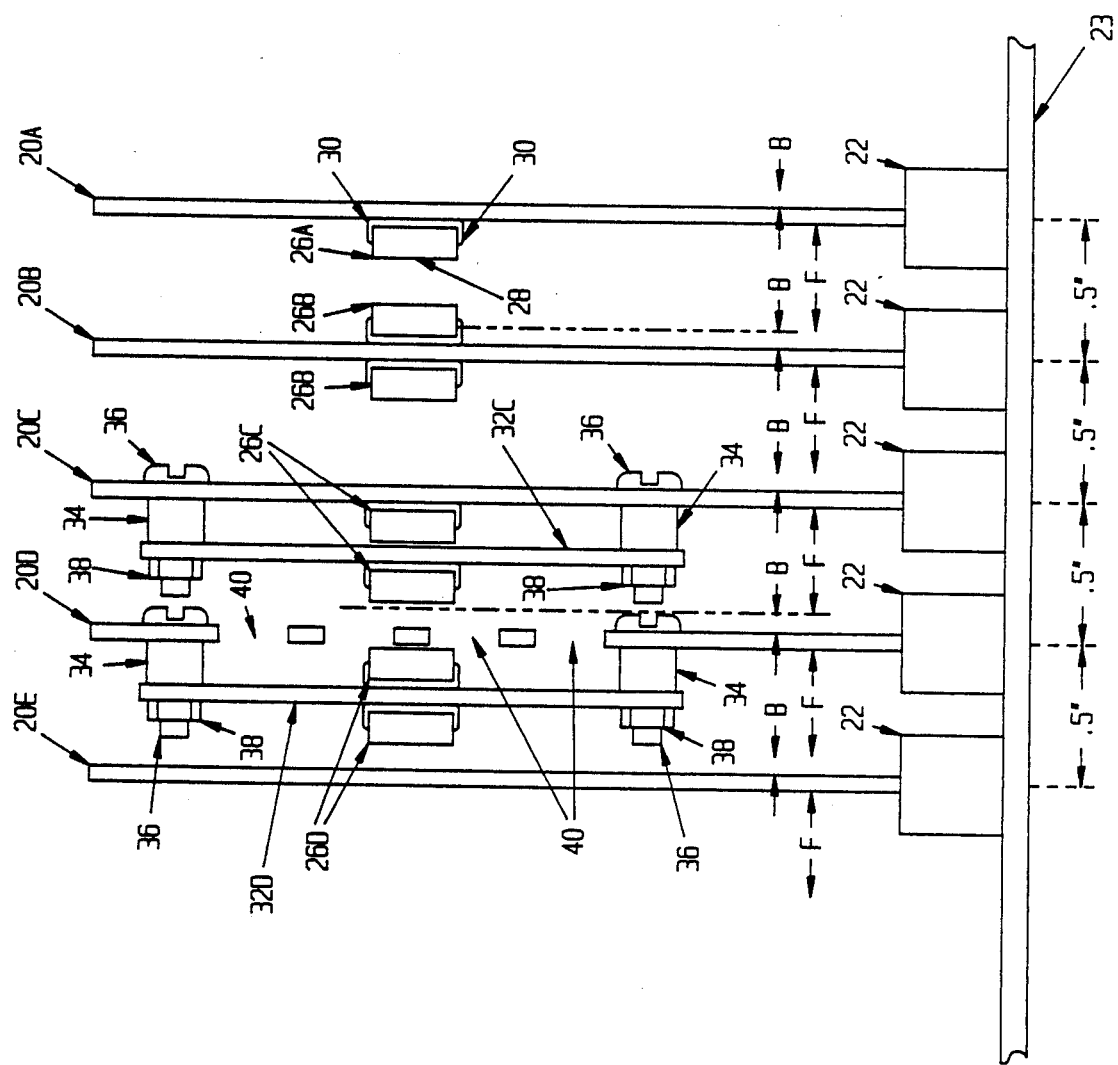
FIG. 1 is a schematic cross-sectional representation of a plurality of boards inserted into a series of parallel bus connectors looking in a direction parallel to the major axis of those parallel bus connectors, said representation showing the front and back maximum permissible extent allowed for such boards by a bus specification and showing various possible ways of mounting memory chips on such boards.

Referring now to FIG. 1, a schematic cross-sectional representation of a plurality of hypothetical boards 20A–20E (collectively called boards 20) inserted into a series of parallel bus connectors 22 are shown. The view is shown looking in a direction parallel to the major axis of those bus connectors, so that the major axis of each such connector is in a direction perpendicular to the figure. The bus connectors 22 are all mounted on a portion of the backplane printed circuit board 23 of a computer system. Although it is not shown, this backplane contains the system bus of the computer system. This bus is a collection of parallel conductors through which the various boards of the computer system communicate. Each of the boards 20 plugged into the bus connectors 22 are printed circuit boards which contain a plurality of conductors, which we shall call wires, or traces. These conductors are connected through connector contacts, which plug into the bus connectors, to the conductors of the system bus. The figure is shown in highly simplified form because all the concepts discussed, so far, are well known in the electronic and computer arts.

The preferred embodiment of the present invention is a memory board designed for use in a type of computer in which bus connectors are mounted in a parallel manner approximately 0.5 inches apart. This spacing is indicated by the double headed arrows between the bottom of the edge connectors 22 labeled "0.5'''" in FIG. 1. With such a relatively small space between adjacent bus connectors it is important that the boards provided for use with this bus be designed to fit with each other. For this reason the manufacturer of the bus has specified the maximum permissible extent to which components of a board 20 inserted into a bus connector 22 should extend in front and in back of the major axis of the bus connectors. According to this specification, the bus connectors 22 have sockets for receiving the edge connector leads 24, shown in FIG. 2, and the extensions of the printed circuit board 20 on which those conductors are mounted. Such edge connectors and the bus connector sockets are well known in the computer arts.

According to the bus specification, the edge connector conductors and the printed circuit board on which they are mounted should be no more than 0.056 inches thick. When installed in the sockets of the bus connector, the length of this 0.056 inch wide printed circuit board extends along the major axis of the bus connectors 22. The maximum permissible extent to which components are allowed to stick out in front of this 0.056 inch thickness is 0.375 inches, which is indicated in FIG. 1 by the double headed arrow labeled "F" for "front". Actually the specification dictates that only non-conductive surfaces should be allowed to extend out the full 0.375 inches. Conductive surfaces are not supposed to extend out more than 0.343 inches from the 0.056 inch thickness of the board inserted in a given bus connector, as is indicated by the arrow labeled "F'''". This is because there is no harm if a non-conductive surface on the front of one board slightly presses against a conductive surface on the back of another, but there would be if a conductive surface on the front of one board touched a conductive surface on the back of another.

The maximum permissible extent to which components, conductive or otherwise, are allowed to stick out from the back of the 0.056 inch thickness of the board which fits into a bus connector is 0.063 inches. This distance is indicated in FIG. 1 by the double headed arrows labeled "B" for "back". It can be seen that the permissible back extent B is much less than the permissible front extent F.

The fact that the distance F is so much larger than the distance B is fine for most boards which place all their components, such as resistors, capacitors and memory chips, on the front side of a printed circuit board. For example, if one wishes to manufacture a board with memory chips mounted on the front side of a board this is usually no problem. This is indicated by the chip 26A shown on the front side of board 20A at the right hand side of FIG. 1. The memory chips 26A–26D (collectively called chips 26) shown in FIG. 1 are surface mounted chips. They each have a plastic body 28 encapsulating the actual semiconductor die which stores electronic data and a plurality of "j" shaped leads 30. Such chips are called an "SOJ" chips because they are surface mounted chips with "j" shaped leads. As is well known in the art of board level electronics, such SOJ chips can be automatically placed so that their "j" shaped leads align with exposed conductive surfaces, called pads, on wires located in the board 20A, and then be soldered to those pads. The particular type of SOJ chips used in the preferred embodiment of the invention described are one megabit DRAM's having a specified maximum thickness, that is, height off the surface of the board they are mounted on, of approximately 0.140 inches. Such chips can be purchased from a plurality of vendors. For example they can be purchased from Mitsubishi Electric Corporation, Mitsubishi Denki Building, Marunouchi, Tokyo 100, Japan, as part number M5M41000AJ.

As is indicated by the chip 26A attached to the front of board 20A in FIG. 1, there is no problem making a memory board with such one megabit SOJ DRAM's on just one side, since the maximum thickness of such a chip is only 0.140 inches and the maximum permissible front extent is 0.375 inches.

But one of the advantages of the newer surface mounted chips over the more traditional chips, which had contact pins that went all the way through the printed circuit boards to which they were connected, is that it is possible to mount such surface mounted chips on both sides of the same part of a given board. This is because the surface mounted chips only contact the side of the board on which they are mounted and, thus, it is possible, in a multi-layered printed circuit board to place electrically independent pads and surface mounted chips connected to those pads on opposites sides of the same portion of such a board. This mounting of memory chips on both sides of a printed circuit board would be very desirable because it would virtually double the memory capacity which could be placed on a board. But, as is shown by the two SOJ chips 26B mounted on the front and back sides of board 20B in FIG. 1, this creates a problem because the chip 26B on the back side of the board sticks out 0.140 inch, which is more than twice the maximum permissible back extent B.

One could try to mount two layers of memory chips within the maximum permissible front distance F in the manner shown on board 20C of FIG. 1. This board has a daughter board 32C which is spaced in a parallel manner above the front surface of the board 20C by a plurality of spacer sleeves 34. Since the daughter board is supported by the board 20C, the board 20C is called a mother board. Each of the sleeves 34A is inserted around screw 36 which is inserted in a hole in the back of the board 20C and extends through a hole in the daughter board 32C. A Nut 38 is screwed onto the end of each of the screws 36, and these nuts hold the screws 36, their associated spacer sleeve 34 and the daughter board 32C in place.

Since the daughter board, like the mother board, is only about 0.056 inches thick, and since each of the SOJ chips extend 0.140 inches from the boards on which they are mounted, the minimal extent of such an arrangement from the front surface of the mother board if the daughter board touches the chip 26C on the mother board would be 0.140 inches for the chip on the mother board, plus 0.056 inches for the daughter board, plus 0.140 inches for the chip on the daughter board, or a total of 0.336 inches. Of course, 0.336 inches is less than the maximum permissible front extent of 0.375 inches, but only by 0.039 inches. That means that even if the top of the chip mounted on the daughter board extended all the way out to the 0.375 inch maximum permissible front extent, the maximum possible distance between the chip 26C on the mother board and the bottom of the daughter board would be 0.039 inches, or less than one twenty-fifth of an inch. In the simplistic example shown on board 20C of FIG. 1 in which there is only one chip on the mother board and one chip on the daughter board, this might not be such a problem. But in a practical memory board, where there is a desire to place a large number of chips closely together on a board, this would not be practical. This is because if a large area of such chips on the mother board was covered by a daughter board located only one twenty-fifth of an inch away from those chips, it would be very difficult for the chips on the mother board to receive proper air cooling. This would tend to elevate the temperature of those chips to such high levels that they would start to malfunction and suffer permanent damage. For this reason the approach shown on board 20C is not a practical way to mount two layers of chips on one memory device.

After studying the problem of how to mount two layers of chips on a memory board, the inventors of the present invention came up with the scheme indicated on board 20D of FIG. 1. According to this scheme, a daughter board 32D is mounted on the board 20D with the same type of spacer sleeves 34, screws 36 and nuts 38. This makes the board 20D a mother board. SOJ memory chips are mounted on both sides of the daughter board 32D. Since the chip 26D on the front of the daughter board is 0.140 inches thick, the daughter board is 0.056 inches thick, and the chip 26D on the back side of the daughter board is 0.140 inches thick, the maximum distance between the memory chip on the back side of the daughter board 32D and the front of the mother board 20D is the same 0.039 inches discussed above with regard to the board 20C, if the top of the memory chip on the front of the daughter is not to extend out more than the maximum permissible front distance of 0.375 inches. But in the current invention, this spacing of no more than one twenty-fifth of an inch does not create any overheating problems because the surface of the mother board opposite the chip 26D mounted on the back side of the daughter board is full of ventilation holes 40. These holes let sufficient air circulate over the surface of the chips 26D to prevent overheating.

Figure 2:
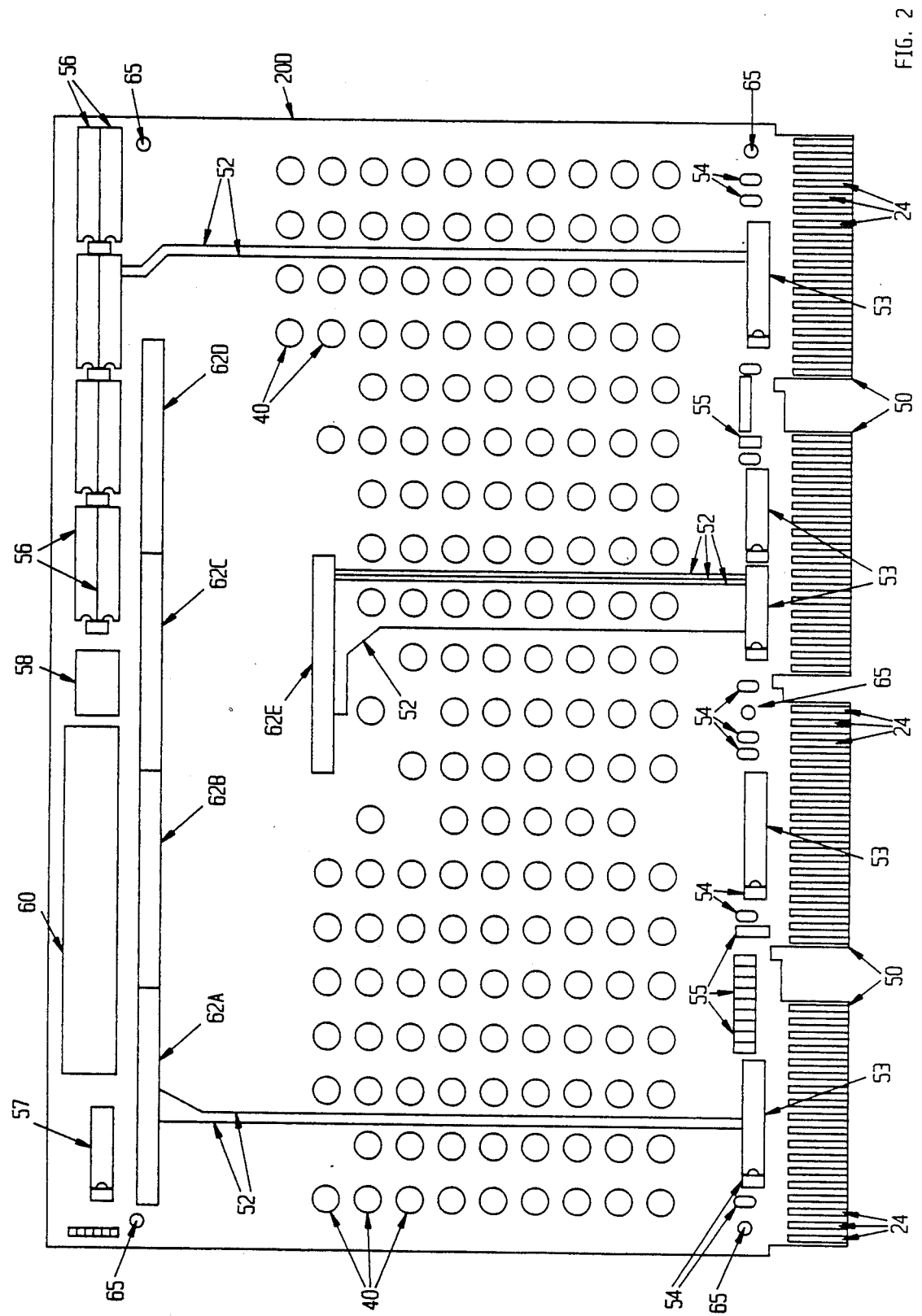
FIG. 2 is a view of the front side of the mother board of the memory board of the preferred embodiment of the present invention.

Referring now to FIGS. 2-5, a more accurate representation of the preferred embodiment of the present invention is shown. FIG. 2 shows the front side of the mother board 20D before the daughter board 32D is mounted on it. At the bottom of the mother board 20D are four edge connector extensions 50 on which edge connector leads 24 are shown. Each such extension 50 is designed to fit into a particular socket of the bus connector 22 into which the board is to be plugged. As is common with computer boards, each edge connector extension 50 has connector leads 24 on its back side, immediately behind those shown on its front.

As can be seen from the front surface of the mother board 20D, it has a plurality of conductive wires 52, called traces. In FIG. 2 these wires are only represented schematically since there are so many of them, that if they were shown accurately and in detail, it would make the figure unnecessarily complex. The board 20D actually has eight layers of conductors, one for carrying ground, one for carrying the positive voltage supply and six for carrying signals of various types. Just above the edge connector leads 24 are a plurality of receiver chips 53 and their associated capacitors 54. These receiver chips receive signals derived from the system bus by the edge connector leads 24 and amplify them for transmission to the various parts of the combined memory board formed by mother board 20D and daughter board 32D. Also located down near the receiver chips 53 are a plurality of jumpers 55 which are used to change various settings of the memory device.

Located in the upper right hand corner of the front of the mother board is a row of non-bus addressable memory chips 56 and their associated capacitors 54. These 1 megabit DRAM memory chips 56 do not constitute any of the bus-addressable memory space of which it is the purpose of the memory board to provide. Instead the chips 56 provide RAM memory for use by the ASIC, or application specific integrated circuit chips 59, described below with regard to FIG. 3. Also located on the front of the mother board 20D is delay line chip 57 which is used in conjunction with some of the logic functions performed by the ASIC's, a large capacitor 58, and a fifty pin connector 60 for connecting to additional lines of a so-called PIM bus.

The PMI, (private memory interconnect) bus is a separate set of parallel bus conductors which lets a computer processor communicate with its private memory while the rest of the system bus is being used for other reasons. This is beneficial since the demand for communication between a processor and its memory is very high, and it thus lets that high demand for communication be met without taxing the rest of the bus. The memory board shown in FIGS. 2-5 is designed to communicate with a processor board through such a PIM bus. According to the bus standard used by the memory board of the preferred embodiment, the rightmost two of the four edge connector extensions 50 connect to lines of the computer system wide bus. The memory board of the preferred embodiment does not monitor most of the system wide bus lines connected to these rightmost two edge connector extensions. The leftmost two of the memory board's edge connector extensions are connected to the PMI bus. But since the PMI bus requires more conductors than are connected to these two connector extensions, it also uses conductors on a separate cable which are connected to the fifty-pin connector 60.

Below the fifty-pin connector and the rows of memory chips on FIG. 2 can be seen rows of female electrical connector sockets 62A-E. The purpose of these connectors is to mate with the male connectors 64 shown in FIG. 3 and, thus, connect the wires on the mother board 20D with those on the daughter board 32D. These connector sockets come in units of forty each. Each such unit has twenty sockets in each of two closely spaced parallel rows. Four such units, 62A-D are located in a line immediately below the fifty-pin edge connector, and one such unit, 62E, is located approximately half way between the left and right hand sides of the board, a small distance below unit 62C.

Also shown in FIG. 2 are five screw holes 65. Two of these are located near the upper side edges of the mother board, and three of them are located on the left, right and center portions of the board, respectively, just about even with the row of receiver chips 53. These are the holes into which the screws 36 are inserted to mount the daughter board 32D.

Figure 4:
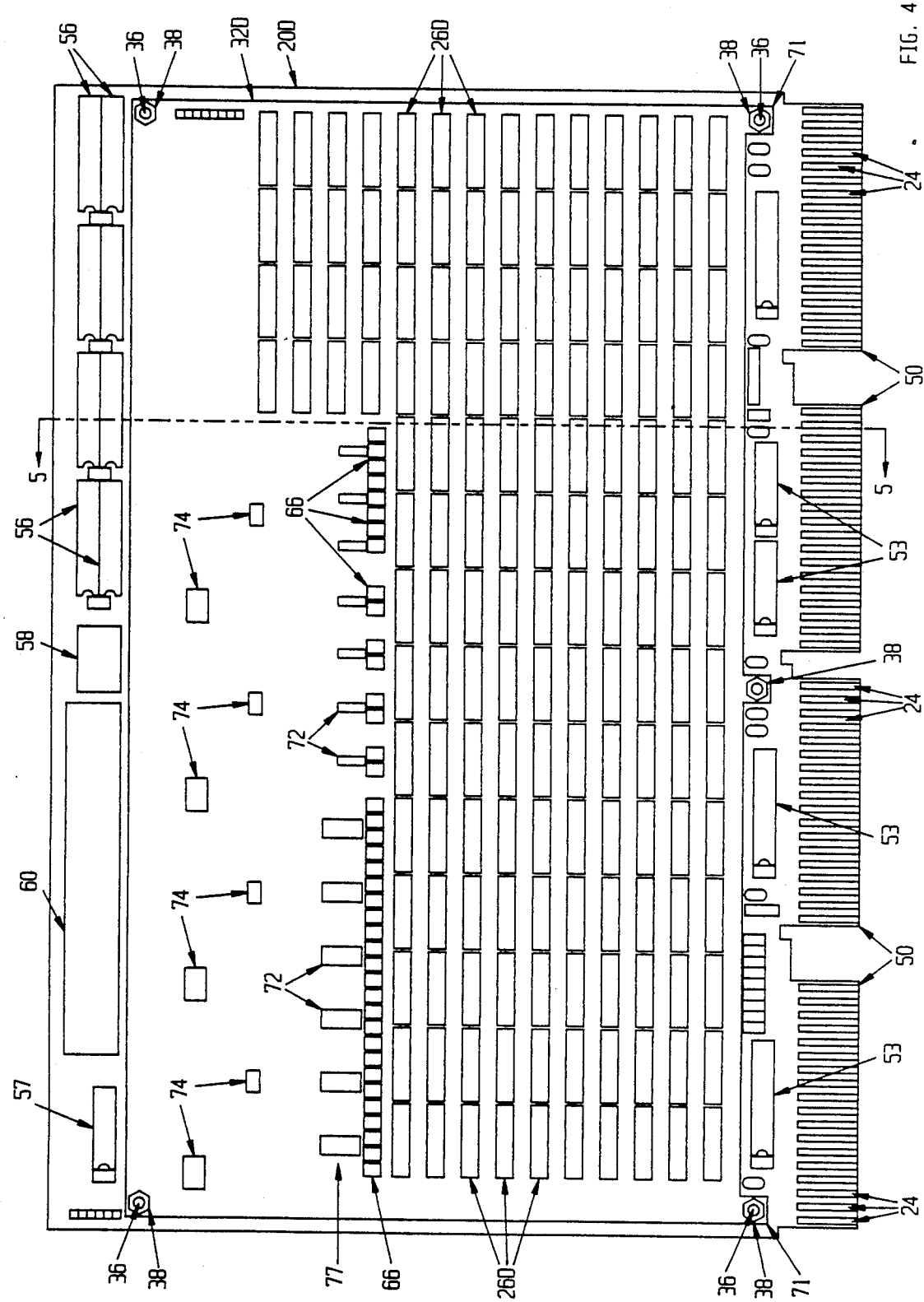
FIG. 4 is a view of the front side of the completely assembled memory board of the preferred embodiment of the present invention showing the front side of its daughter board, and that portion of the front side of its mother board which is not covered by the daughter board.
Figure 5:
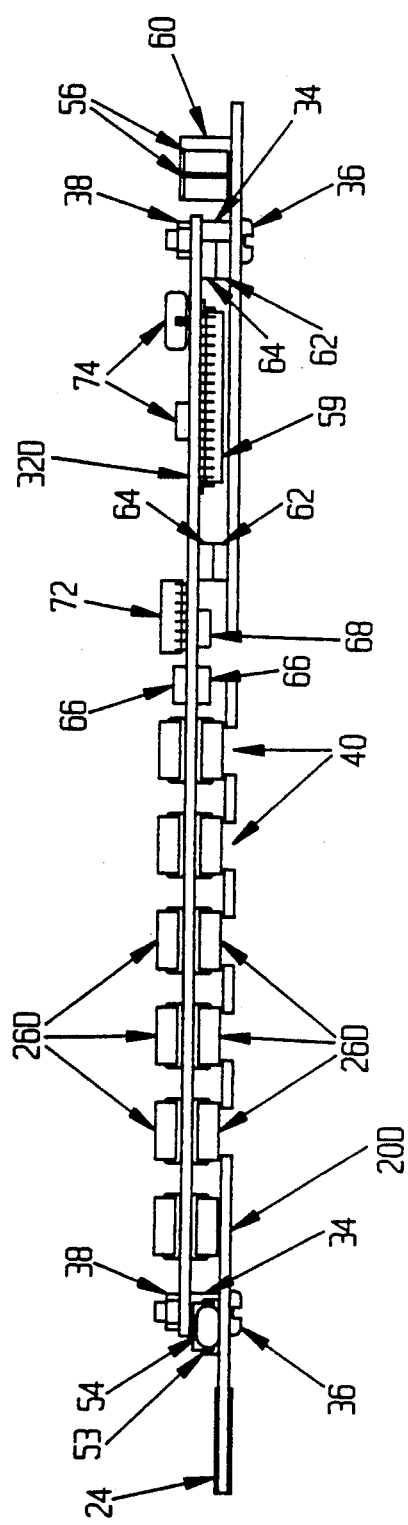
FIG. 5 is a cross-sectional side view of the memory board of the preferred embodiment taken along the lines 5—5 shown in FIG. 4.

Perhaps the most striking feature about the mother board 20D is the plurality of ventilation holes 40 located throughout much of its surface. The area covered by these holes corresponds to that part of the board which is covered by the array of memory chips 26D located on the back side of the memory board 32D, shown in FIG. 3, which overlays the mother board when the combined memory board is assembled as shown in FIGS. 4 and 5.

Figure 3:
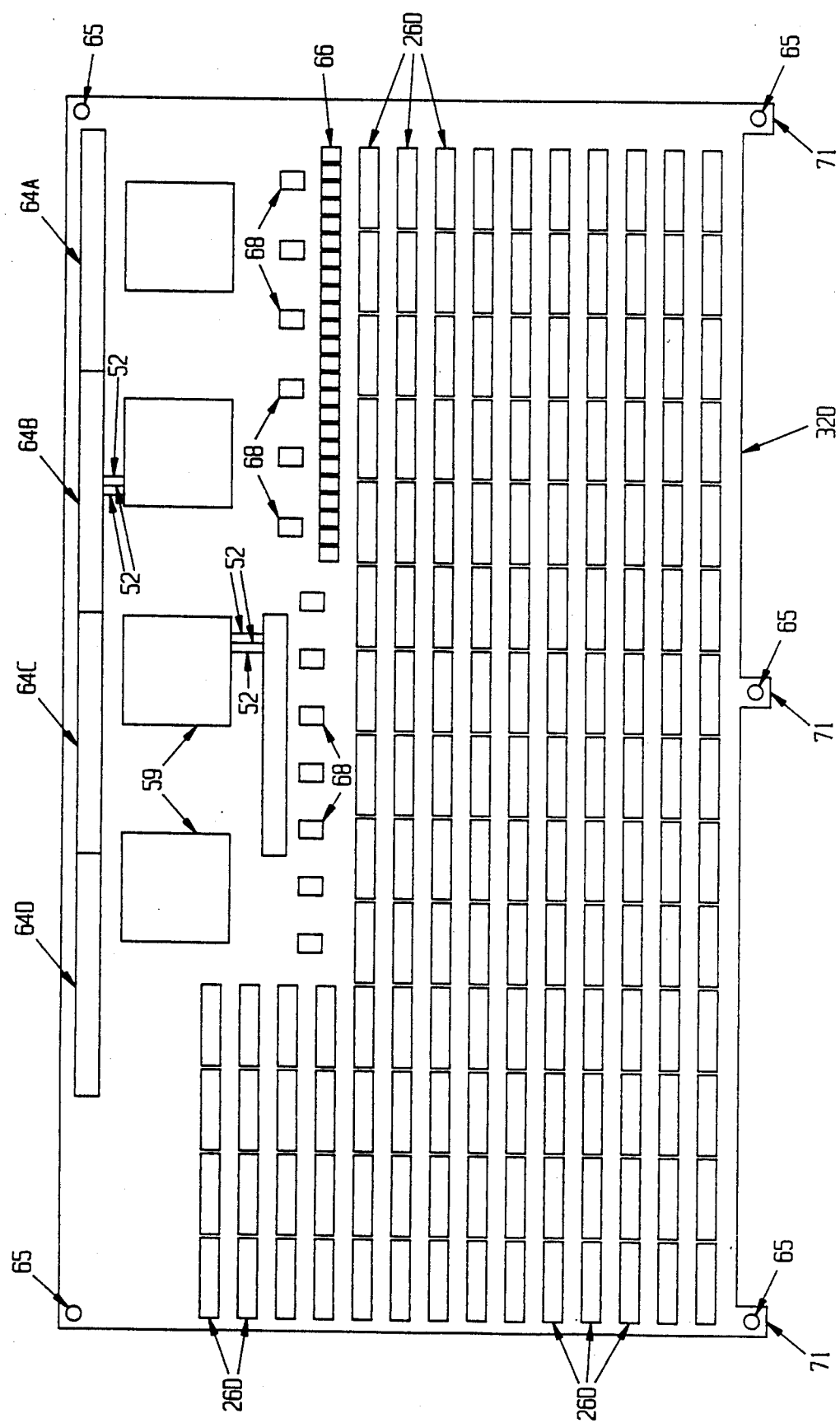
FIG. 3 is a view of the back of the daughter board of the memory board of the preferred embodiment of the present invention.

Referring now to FIG. 3, the back side of the daughter board 32D is shown. This is the side of the daughter board which faces the front side of the mother board 20D shown in FIG. 2.

The daughter board 32D is an eight layer printed circuit board of the same general construction as the mother board 20D. Like the mother board, it includes a plurality of wires, or traces, 52. As in FIG. 2, in FIG. 3 these wires are only represented schematically because their number and fine detail would make FIG. 3 too complex if they were shown in detail. It includes five groupings of male connectors 64A-E, which mate, and make electrical connection, with the female socket groupings 62A-E on the front surface of the mother board, respectively.

The back side of the daughter board contains 156 one megabit SOJ DRAM chips 26D of the type described above with regard to FIG. 1. These are located in four columns of fourteen chips each at the left hand side of the back of the daughter board, and ten columns of ten chips each in the central and right hand portions of the board. Above the ten columns of ten chips each, a row of resistors 66 a located. Above them is a row of capacitors 68, and above them are 4 ASIC's, or application specific integrated circuits 59. These ASIC's are integrated circuits whose functionality has been specifically designed to perform certain logical functions for the combined memory board, such as performing the logic necessary to interface to the PMI bus, and performing initialization and testing of the memory located on the combined board. It should also be noted that each of the SOJ DRAM chips 26D mounted on each side of the mother board 32D has a small capacitor mounted directly below it, although this is not shown in any of the figures.

The daughter board 32D also contains five screw holes 65. Two are located near the upper corners of the board and the remaining three are located in the three extensions 71 which extend down from the two sides and the center of the bottom edge of the daughter board. These screw holes are used by the screws 36 which mount the daughter board 32D to the mother board 20D.

Referring now to FIG. 4, a front view is shown of the combined memory board formed by the mother board 20D and the daughter board 32D, once the two are connected.

The front side of the daughter board 32D, contains 156 one megabit SOJ DRAM chips 26D laid out in virtually on top of the corresponding chips 26D on the back side of the board. Above the ten columns of ten DRAM's each is a row of resistors 66. Immediately above this is a row of logic chips 72 which perform functions such as DRAM refresh, driving address lines, etc. Above this row of chips are two rows of capacitors 74.

Referring now to FIG. 5, a cross sectional view of the combined memory board, formed when the mother board 20D and the daughter board 32D are assembled, is shown. This cross section is taken along the line 5—5 shown in FIG. 4. The daughter board 32D is mounted upon the mother board 20D by screws 36, spacer sleeves 34, and nuts 38, in the same manner as is the daughter board 32C, described above with regard to FIG. 1. That is, the screws 36 are inserted through the five screw holes 65 in the back side of the mother board 20D. A spacer sleeve 34 is placed around each of the screws that extend out through the front side of the mother board. Then the five screw holes 65 of the daughter board are placed over the remaining portion of the screws 36. This is done in such a manner that the 15 male connectors 64 in each of the five units of such connectors shown on the back of the daughter board in FIG. 3 are properly inserted into their corresponding sockets 62, located in each of the five units of such sockets shown on the front side of the mother board in FIG. 2. Finally a nut 38 is tightened around the end of each screw 36 to securely fasten the daughter board to the mother board. The spacer sleeves 34, the screws 36 and the nuts 38 are all made of non-conductive plastic in the preferred embodiment.

In the preferred embodiment, the length of the spacer sleeve 34 is 0.156 inches. This causes the spacing between the 0.140 inch thick memory chips, mounted on the back of the daughter, to be only approximately 0.016 inches from the front surface of the mother board. But since, as is shown in FIGS. 2 and 5, a high percent of the surface of the mother board which faces these chips is made up of ventilation openings 40, this does not cause the chips to overheat. It should be noted that there are not any ventilation holes located under the ASIC's 59, but this is not a problem since the ASIC's generate much less heat than do the memory chips. If in another embodiment of the invention, however, electronic components other than memory chips placed on the back side of daughter board generated excessive heat, ventilation holes could be placed beneath them as well.

The exact specifications of the electronic components, such as resistors, capacitors, and chips mounted on the combined memory board of the preferred embodiment, and the exact wiring diagrams used to connect them have not been disclosed here, since the design of memory boards is so well known in the digital arts.

It can be seen that the invention achieves all of the above mentioned objects. It provides a bus device, such as a memory board, which allows a relatively large number of components, such as memory chips, to be mounted on it while fitting into a relatively small bus slot. It also provides such a bus device which allows such a relatively large number of components, such as chips, to be mounted into a bus slot, even though the bus specification states that the maximum permissible extent which components may stick out from the back of such a board is too narrow to allow chips to be mounted on its back side. Furthermore, it provides a bus device which has a mother board and a daughter board and which allows the daughter board to have relatively good ventilation, while at the same time minimizing the distance between the mother and daughter boards.

It should be understood that the foregoing description and the drawings are given merely to explain and illustrate the invention, and the invention is not to be limited thereto, except insofar as the appended claims are so limited, since those skilled in the art who have the disclosure before them will be able to make modifications and variations therein, without departing from the scope of the invention.

For example, it should be understood that the present invention can be used with bus devices other than memory boards. The basic concepts of a bus device having a daughter board, with heat generating components on both sides, mounted closely over a surface of a mother board which has no such components mounted on it and which has ventilation holes to prevent overheating could be used with processor boards, I/O boards, and many other types of boards as well.

It should also be understood that other types of electronic components besides chips, and other types of electronic components besides surface mounted components, could be used with the invention.

It should further be understood that the invention could be used with different bus specifications than that, described above, for which the preferred embodiment of the invention has been designed. For example, the invention can be used with bus specifications which specify different front and back maximum permissible extents than those described above, and which used different size cards and different types of bus connectors than does the bus specification described above. The invention could also be used in bus devices designed for use in electronic systems other than computer systems.

What is claimed is:

1. A bus device for mating with a multi-conductor bus connector connected to the multiple conductors of a backplane of a computer system, said bus device comprising:
    a daughter printed circuit board having:
        electronic components mounted on both of its sides: and
        a plurality of printed circuit wires connected to said components;
    a mother printed circuit board having:
        a plurality of connector contacts of proper shape, position and number for mating with said bus connector and making connection through said, bus connector with a plurality of the conductors of said backplane;
        a plurality of printed circuit wires; and
        means for electrically connecting those wires to said connector contacts;
    means attached to said mother board mounting said daughter board in a parallel manner a predetermined distance above the surface of said mother board;
    means electrically connecting said wires of said daughter board to said wires of said mother board independently of said backplane;
    wherein the portion of said mother board under said daughter board contains at least one ventilation opening to ventilate electronic components on the side of the daughter board that faces said mother board.

2. A bus device for mating with a multi-conductor bus connector connected to the multiple conductors of a backplane of a computer system, said bus device comprising:
    a daughter printed circuit board having:
        integrated circuit chips mounted on both of its sides: and a plurality of printed circuit wires connected to said chips;
a mother printed circuit board having:
a plurality of connector contacts of proper shape, position and number for mating with said bus connector and making connection through said bus connector with a plurality of the conductors of said backplane;
a plurality printed circuit wires; and
means for electrically connecting those wires to said connector contacts;
means attached to said mother board mounting said daughter board on said mother board in a parallel manner a predetermined distance above the surface of said mother board;
means electrically connecting said wires of said daughter board to said wires of said mother board independently of said backplane; and
wherein the portion of said mother board under the chips mounted on the side of said daughter board facing said mother board contains no chips.

3. A bus device as in claim 2, wherein:
the highest of said chips mounted on the side of the daughter board which faces the mother board sticks up from the daughter board toward the mother board by a distance which we shall call the maximum chip height; and
said predetermined distance at which the daughter board is mounted above the surface of the mother board is less than twice said maximum chip height.

4. A bus device as in claim 3, wherein:
said bus connector with which the mother board of said bus device is designed to be mated has a major axis and is one of a plurality of connectors connected to said backplane with their major axes parallel;
said backplane has a bus standard, for the purpose of enabling bus devices made by different manufactures to fit into adjacent parallel connectors on said system bus without touching each other, said standard specifying the maximum permissible extent to which a board which is plugged into one of said bus connectors should extend beyond the major axis of that bus connector in each of two directions perpendicular to that axis, with the maximum permissible extent in one of said two directions being less than that in the other; and
the lesser of said two maximum permissible extents is sufficiently small that chips of said maximum chip height cannot be mounted on both sides of a printed circuit board plugged into one of said bus connectors without extending beyond said lesser of said two maximum permissible extents.

5. A memory board designed for mating with a multi-conductor bus connector connected to the multiple conductors of a backplane of a computer system, said memory board comprising:
a daughter printed circuit board having:
memory chips mounted on both of its sides: and
a plurality of printed circuit wires connected to said memory chips;
a mother printed circuit board having
a plurality of connector contacts of proper shape, position and number for mating with said bus connector and making connection through said bus connector with a plurality of the conductors of said backplane;
a plurality of printed circuit wires; and
means for electrically connecting those wires to said connector contacts;
means attached to said mother board mounting said daughter board in a parallel manner a predetermined distance above the surface of said mother board;
means electrically connecting said wires of said daughter board to said wires of said mother board independently of said backplane; and
wherein the portion of said mother board under said daughter board contains at least one ventilation opening to ventilate chips on the side of the daughter board that faces said mother board.

6. A memory board as in claim 5, wherein:
the highest of said memory chips mounted on the side of the daughter board which faces the mother board sticks up from the daughter board toward the mother board by a distance which we shall call the maximum chip height; and
said predetermined distance at which the daughter board is mounted above the surface of the mother board is less than twice said maximum chip height; and
there are no memory chips mounted on the mother board underneath those located on the side of the daughter board facing the mother board.

7. A memory board as in claim 6, wherein:
said multi-conductor bus connector with which said memory board is designed to be mated has a major axis, and is one of a plurality of connectors connected to said backplane with their major axes parallel;
said backplane has a bus standard, for the purpose of enabling bus devices made by different manufacturers to fit into adjacent parallel bus connectors on said system bus without touching each other, said standard specifying the maximum permissible extent to which a board which is plugged into one of said bus connectors should extend beyond the major axis of that bus connector in each of two directions perpendicular to that axis, with the maximum permissible extent in one of said two directions being less than that in the other; and
the lesser of said two maximum permissible extents is sufficiently small that memory chips of said maximum chip height cannot be mounted on both sides of a printed circuit board plugged into one of said connectors without extending beyond said lesser of said two maximum permissible extents.

* * * * *